United States Patent
Motwani

(10) Patent No.: US 9,911,509 B2
(45) Date of Patent: Mar. 6, 2018

(54) COUNTER TO LOCATE FAULTY DIE IN A DISTRIBUTED CODEWORD STORAGE SYSTEM

(71) Applicant: Intel Corporation, Santa Clara, CA (US)

(72) Inventor: Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 14/099,551

(22) Filed: Dec. 6, 2013

(65) Prior Publication Data
US 2015/0162100 A1 Jun. 11, 2015

(51) Int. Cl.
| G11C 29/00 | (2006.01) |
|---|---|
| G11C 29/44 | (2006.01) |
| G11C 29/42 | (2006.01) |
| G11C 29/04 | (2006.01) |

(52) U.S. Cl.
CPC ............ *G11C 29/44* (2013.01); *G11C 29/42* (2013.01); *G11C 29/82* (2013.01); *G11C 2029/0409* (2013.01); *G11C 2029/0411* (2013.01)

(58) Field of Classification Search
CPC .................................................... G11C 29/44
See application file for complete search history.

(56) References Cited

U.S. PATENT DOCUMENTS

| 5,267,242 | A * | 11/1993 | Lavallee et al. ............. 714/6.32 |
|---|---|---|---|
| 7,359,261 | B1 | 4/2008 | Wu et al. |
| 7,984,345 | B2 | 7/2011 | Ozawa et al. |
| 8,959,407 | B2 * | 2/2015 | Motwani ........... H03M 13/3723 714/704 |
| 9,037,943 | B2 * | 5/2015 | Motwani ........... H03M 13/2927 714/758 |
| 9,105,305 | B2 | 8/2015 | Werner et al. |
| 2002/0133769 | A1 | 9/2002 | Cowles et al. |
| 2009/0274245 | A1 * | 11/2009 | Brown ................. G11C 7/1006 375/340 |

(Continued)

FOREIGN PATENT DOCUMENTS

| CN | 101178943 A | 5/2008 |
|---|---|---|
| CN | 101310342 A | 11/2008 |
| CN | 103348330 A | 10/2013 |

OTHER PUBLICATIONS

Office Action and Search Report received for Taiwanese Patent Application No. 103138361, dated Dec. 9, 2015, 6 pages including 1 page of English translation.

(Continued)

*Primary Examiner* — Sam Rizk
(74) *Attorney, Agent, or Firm* — Alpine Technology Law Group LLC

(57) ABSTRACT

Methods and apparatus related to utilization of counter(s) for locating faulty die in a distributed codeword storage system are described. In one embodiment, first logic determines a plurality of values. Each of the plurality of values corresponds to a number of zeros or a number of ones in bits read from a portion of each of a plurality of memory dies. Second logic determines one or more candidates as a faulty die amongst the plurality of memory dies based at least in part on a comparison of the plurality of values for the plurality of memory dies. Other embodiments are also disclosed and claimed.

23 Claims, 7 Drawing Sheets

(56) References Cited

U.S. PATENT DOCUMENTS

2012/0266050 A1* 10/2012 Cideciyan ............. H03M 13/05
                                                         714/773
2014/0089760 A1*  3/2014 Schmidt .............. G06F 11/1044
                                                         714/766
2014/0157087 A1*  6/2014 Yurzola et al. ............... 714/773

OTHER PUBLICATIONS

Letters of Patent received for Taiwanese Patent Application No. 103138361, dated Feb. 1, 2017 as Patent No. I569277, 2 pages including 1 page of English translation.
English translation of Office Action received for Chinese Patent Application No. 2014108107774, dated Jul. 19, 2017 and cited in an IDS filed on Jul. 31, 2017, 15 pages.
Office Action received for Chinese Patent Application No. 201410810777.4, dated Jul. 19, 2017, 8 pages.

\* cited by examiner

COUNTER TO LOCATE FAULTY DIE IN A DISTRIBUTED CODEWORD STORAGE SYSTEM

FIELD

The present disclosure generally relates to the field of electronics. More particularly, some embodiments generally relate to counter for locating faulty die in a distributed codeword storage system.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile memory are available beyond the run-time of a program and can be reused. Moreover, new data is typically generated as volatile data first, before the user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like flash memory.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, limit locations at which a device may be used, etc.

Hard disk drives provide a relatively low-cost storage solution and are used in many computing devices to provide non-volatile storage. Disk drives however use a lot of power when compared to flash memory since a disk drive needs to spin its disks at a relatively high speed and move disk heads relative to the spinning disks to read/write data. This physical movement generates heat and increases power consumption. To this end, some higher end mobile devices are migrating towards flash memory devices that are non-volatile.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
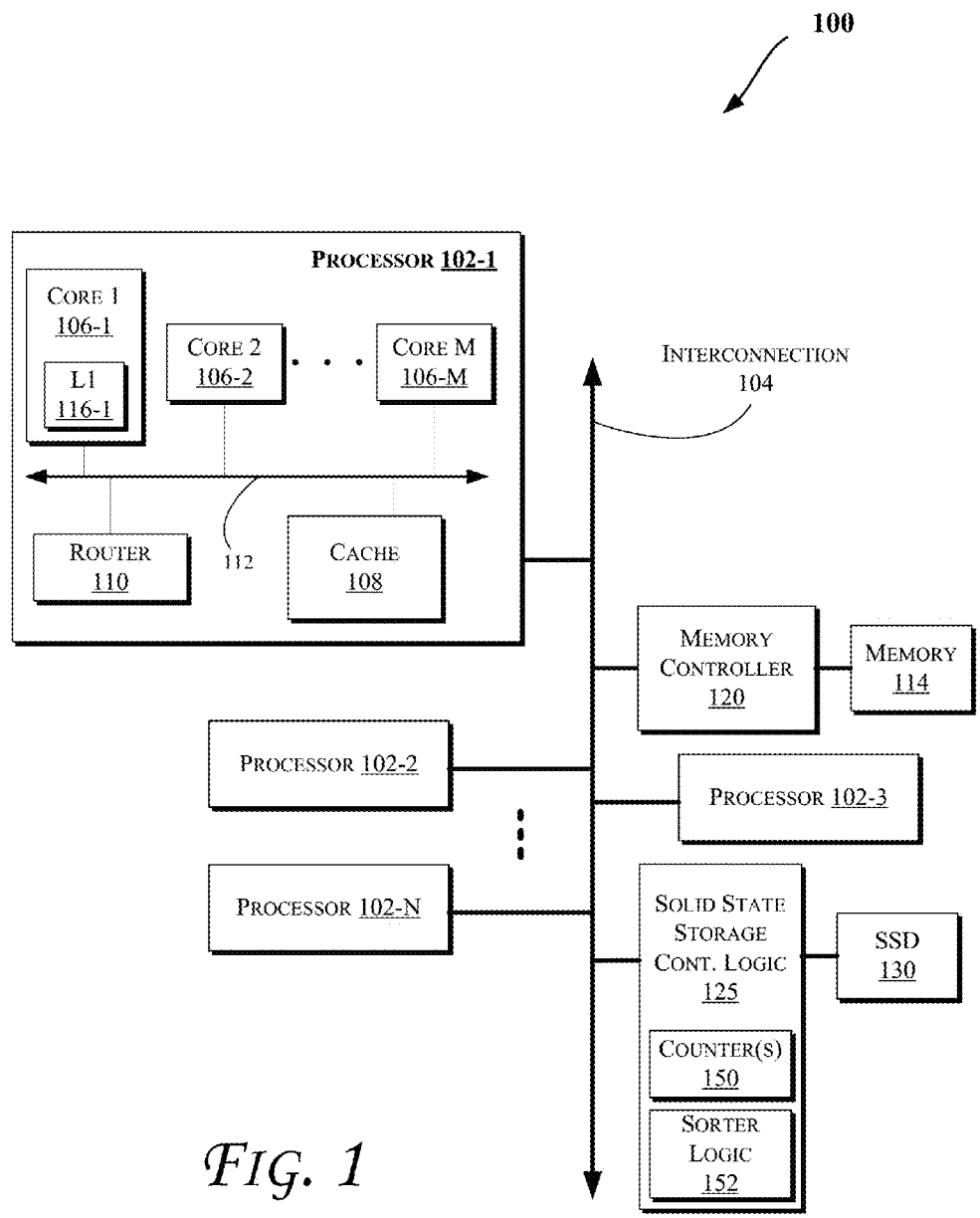
FIGS. 1 and 5-7 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

In the case of Non-Volatile Memory (NVM) such as NAND, NOR, or three dimensional cross-point memory (or other non-volatile memory technologies such as memristors (a portmanteau of "memory resistor"), resistive random access memory, Phase Change Memory (PCM), Spin Torque Transfer Random Access Memory (STTRAM), etc.), Error Correction Code (ECC) may be used to protect data from raw bit errors, e.g., expressed as Raw Bit Error Rate (RBER) which generally refers to the fraction of data bits failing during a read operation. A large ECC codeword spread over multiple memory dies may be utilized in some implementations, e.g., since larger ECC codeword sizes generally provide better resilience to RBER. In case of a fatal ECC error (e.g., an ECC error that impedes forward progress), the retry flow to recover from the fatal ECC error may include the localization of the die with high RBER. The codeword bits in this die may be then reconstructed using an XOR die (e.g., in case of RAID (Redundant Array of Independent Disks) configuration of NVM devices) or decoding done after flagging those bits as erasures.

Moreover, localizing the die with high RBER can be done on an exhaustive search basis. The search has an impact on latency of the retry flow and may prove to be a bottleneck in meeting Quality of Service (QoS) in the system. Instead of randomly selecting a die as failed, it is more efficient to make an educated guess regarding the failed die based on the read bits for example.

To this end, some embodiments provide techniques for utilizing counter(s) to locate a faulty die in a distributed codeword storage system. For example, a bad die may be identified in the first attempt and with a very high probability instead of having to perform an exhaustive search. In an embodiment, the bits read from the dies are separately counted (e.g., by using one or more counters) for the number of zeros and/or ones (e.g., at least one counter per die to count the number of zeros and/or to count the number of ones, although more counters may be used per die, e.g., to count both the number of zeros and ones). These counts are then used to locate the faulty die, as will be further discussed herein.

Further, the techniques discussed herein may be used for any distributed codeword scheme for non-volatile memories and although some embodiments are discussed with reference to an SSD (Solid State Drive) having 3D Cross Point Memory, embodiments are not limited to 3D Cross Point Memory technology and may be expanded to other non-volatile memory technologies such as NOR memory, memristors, resistive random access memory, Phase Change Memory (PCM), Spin Torque Transfer Random Access Memory (STTRAM), NAND, etc. Moreover, QoS can be an important performance parameter and quick detection of a faulty die helps improve the QoS in the retry flow path after an ECC error occurs. Additionally, the counting of zeros/ones is a relatively efficient and/or low-overhead technique which can lead to significant system performance improvement (for example, when compared with an exhaustive search approach).

More particularly, various ECC schemes may be used for non-volatile memory storage. These schemes may consist of storing one ECC codeword in one non-volatile memory die or spreading one ECC codeword across multiple dies. Storing an ECC codeword in a single die has its advantages, particularly for NAND flash memory since the system's QoS cannot be met if one single section calls for read operations from multiple dies. However, for three dimensional cross-point memory such limitations are transcended and storing an ECC codeword across multiple dies is feasible. For instance, for three dimensional cross-point memory, a codeword may be distributed across several dies. The three dimensions refer to the two dimensions within the die and the third dimension across dies. The across die component is generally not available for NAND flash memory since a distributed codeword across dies will have to be read from all dies and that gives rise to a reduced number of channels or less parallelism which in turn reduces the throughput for NAND flash memory. However, a codeword may still be distributed across several dies using NAND flash memory (e.g., to provide redundancy, etc.) with somewhat reduced efficiency for read operations. Storing a single codeword across multiple dies permits larger codeword sizes and also capitalizes on the RBER diversity across dies to offer higher resilience to RBER.

However, storing single codeword or distributed codeword schemes have their own disadvantages. In addition to the latency hit and higher decoding complexity, localizing the die with high RBER is also a problem. In case of an ECC fatal error, it becomes important to localize the high RBER die or outlier (as we will call it going forward, which generally refers to the next die with issues following the high RBER die). Once the outlier is identified, XOR die (e.g., of the RAID) recovery can be used to reconstruct the codeword bits in the outlier to retry decoding. For Reed-Solomon based distributed codeword schemes which may not support an XOR, the codeword bits in the outlier may be declared as erasures during retry decoding. Hence, such retry mechanisms need outlier identification.

Moreover, an exhaustive search generally consists of choosing any die as an outlier and retrying the decoding process. If decoding fails, another die is then chosen as an outlier and this search continues until a successful decode results and if all dies are exhausted as being flagged outliers, recovery is exited. As such, an exhaustive search can have a very large latency impact.

To this end, an embodiment uses the bits read from the non-volatile memory dies to determine a likely candidate as a failed die. Failures of a die generally manifest themselves as word line short circuits or open circuits. Such failures will result in bits being read as all-zeros or all-ones. Since data stored in the medium is likely source coded, the occurrence probability of zeros and ones is half or fifty percent. Hence, reading all-zeros or all-ones is a rare event and the probability of having k zeros or ones read is $2^{-k}$. So, if k bits are read-out of a die and if they are all-zeros or all-ones, this already indicates that that die is highly probable to have gone bad (or the word line read in that die). This is then used as the basis of the bad die detection scheme discussed with reference to some embodiments.

The techniques discussed herein may be provided in various computing systems (e.g., including a non-mobile computing device such as a desktop, workstation, server, rack system, etc. and/or a mobile computing device such as a smartphone, tablet, UMPC (Ultra-Mobile Personal Computer), laptop computer, Ultrabook™ computing device, smart watch, smart glasses, etc.), including those discussed with reference to FIGS. 1-7. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers (such as those discussed with reference to FIGS. 5-7), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a Level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments. Also, in some embodiments, system 100 may include logic (e.g., solid state storage controller logic 125) to control access to one or more Non-Volatile Memory devices (including one or more SSDs 130), where the one or more NVM devices may be provided on the same integrated circuit die in some embodiments.

Furthermore, even though logic 125 is shown to be directly coupled to the interconnection 104 in FIG. 1, logic 125 can alternatively communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 5-6), etc.). Additionally, logic 125 may be incorporated into a memory controller logic (such as those discussed with reference to FIGS. 1 and 5-7) or provided on a same integrated circuit device in various embodiments.

Figure 2:
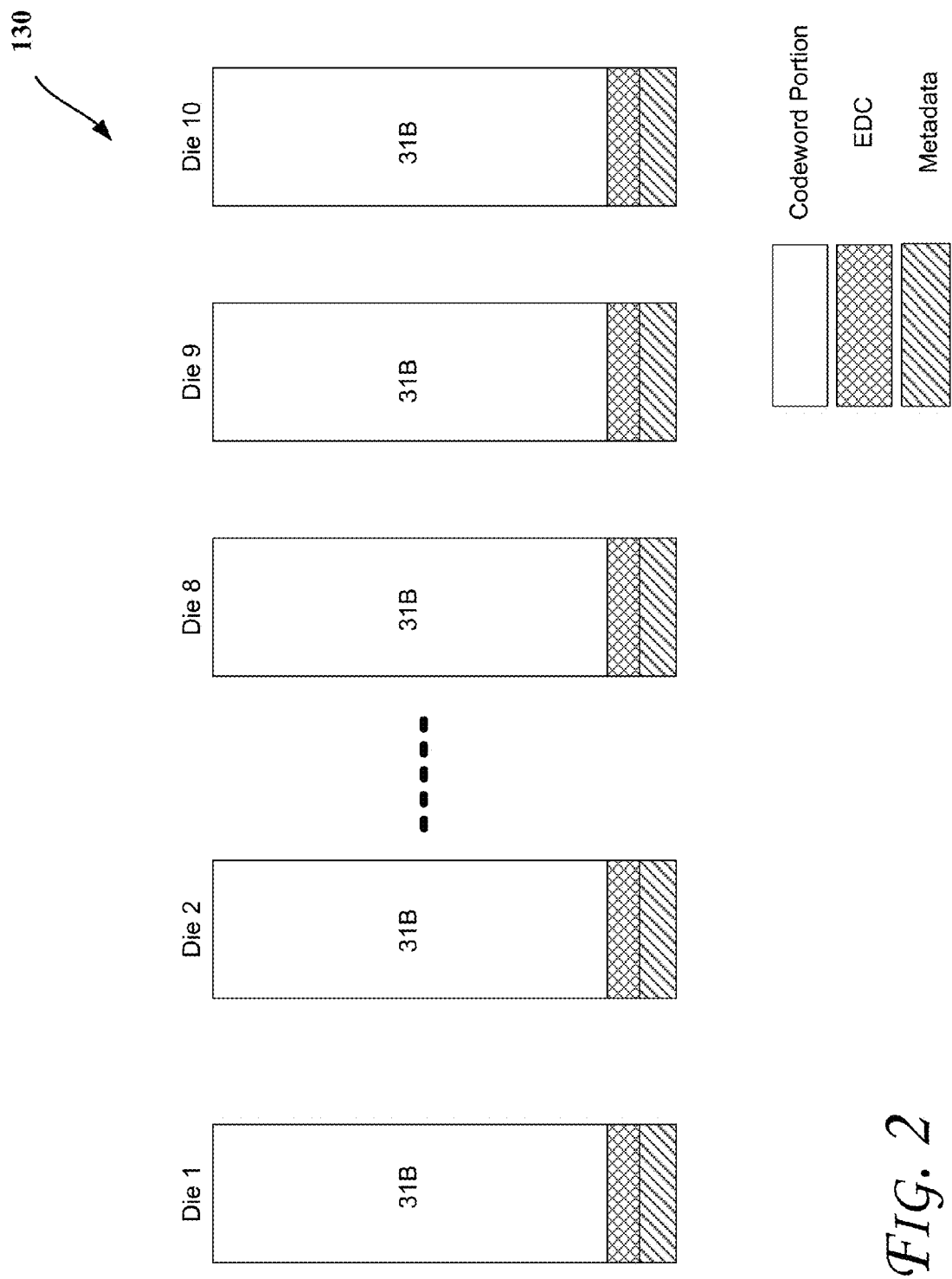
FIG. 2 illustrates a distributed codeword architecture, according to an embodiment.
Figure 3:
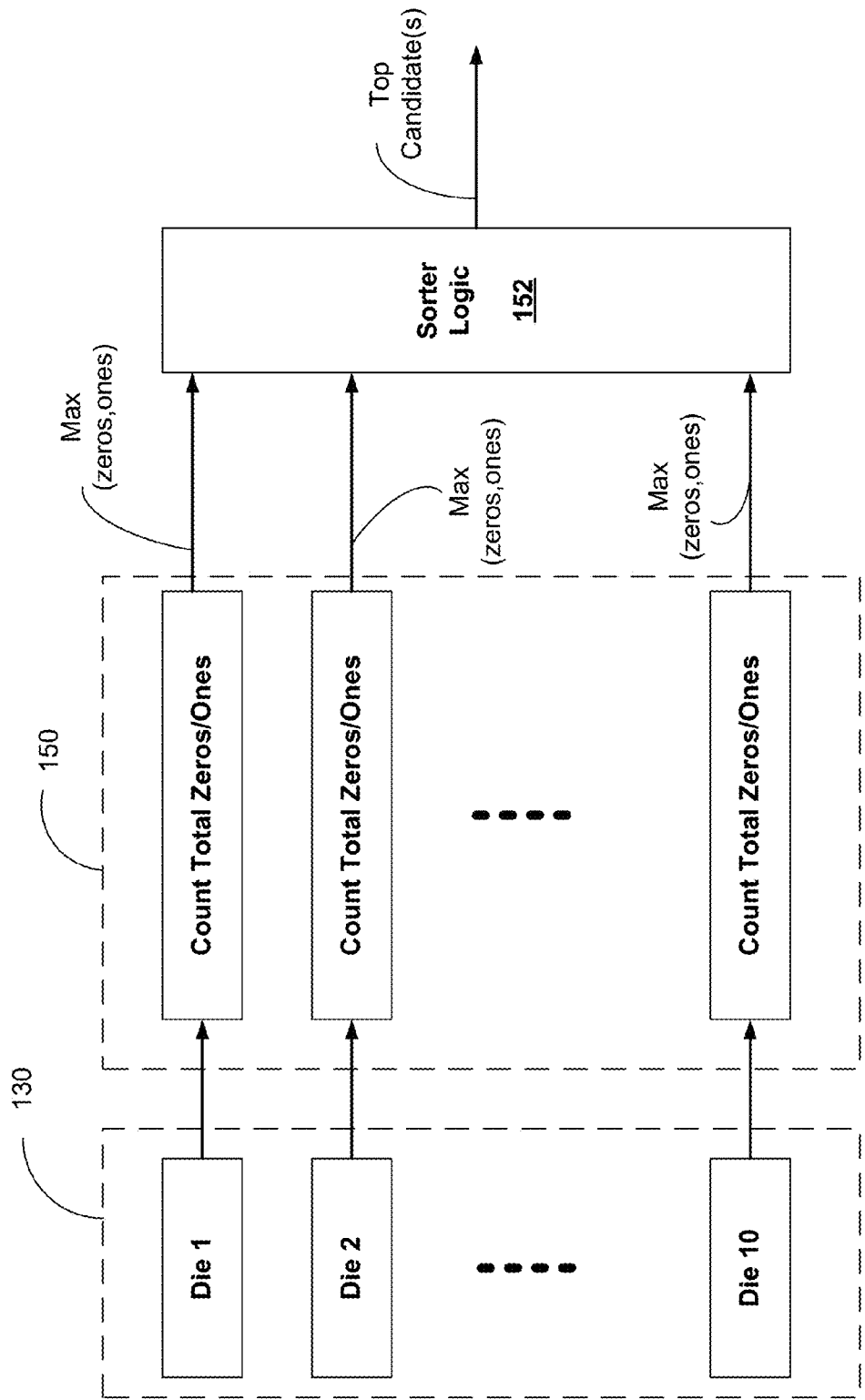
FIG. 3 illustrates a flowchart of a faulty die detection method, according to an embodiment.

Additionally, logic 125 may be coupled to (or alternatively include, e.g., as shown in FIG. 1) one or more counters 150 (to count the zeros and ones read from die(s) that form the SSD 130) and a sorter logic 152 (to sort the counted values by the counters 150 as will be further discussed herein with reference to FIGS. 2-3). System 100 may also include one or more sensors (not shown) coupled to logic 125 to provide information (e.g., in the form of one or more bits or signals) to indicate the status of or values detected by the one or more sensors. The sensor(s) may be provided proximate to components of system 100 (or other computing systems discussed herein such as those discussed with reference to other figures including 5-7, for example), including the cores 106, interconnections 104 or 112, components outside of the processor 102, SSD, SSD bus, SATA bus, logic 125, etc., to sense variations in various factors affecting power/thermal behavior of the system/platform, such as temperature, operating frequency, operating voltage, power consumption, and/or inter-core communication activity, etc.

FIG. 2 illustrates a distributed codeword scheme, according to an embodiment. More specifically, FIG. 2 illustrates data stored in a plurality of dies of SSD 130. Furthermore, although some embodiments are discussed with reference to an SSD (Solid State Drive) having 3D Cross Point Memory flash memory, embodiments are not limited to 3D Cross Point Memory technology and may be used with other non-volatile memory technologies such as NOR memory, memristors, resistive random access memory, Phase Change Memory (PCM), Spin Torque Transfer Random Access Memory (STTRAM), NAND, etc.

As shown in FIG. 2, a (e.g., Reed-Solomon (RS)) codeword is distributed over 10 dies. For example, 256B of user data is encoded per RS code to a 310B RS codeword, which can correct 24 symbol errors. 10B of space is still available and this is shared by the metadata. In FIG. 2, EDC refers to Error Detection Code, which includes 0.5B of space on each die. Moreover, even though specific byte sizes are discussed with reference to FIG. 2, other (e.g., non-equal) byte sizes may be utilized per die (e.g., by scaling the available space (for example based on percentages)).

FIG. 3 illustrates a flowchart of a faulty die detection scheme, according to an embodiment. The bad die detection scheme utilizes a running count of the (e.g., maximum) number of zeros and/or ones as the codeword bits are read from each die (e.g., with counters 150, which include a counter per die for number of zeros read from each die and/or another counter per die for the number of ones read from each die). After k bits are read from each die, a comparison of the count is done by sorter logic 152 that sorts the count values to determine the top and/or bottom entries in the correct order (i.e., identifying dies with the most ones and/or most zeros, respectively—or vice versa depending on the sorting being done in ascending or descending orders).

For example, if sorter logic 152 sorts the counted values based on the number of ones in ascending order, the top results are the most likely candidates for faulty die(s) (e.g., since as discussed herein, the dies with all/most ones (or zeros) are likely faulty), the bottom results would be the die(s) with the least ones (i.e., most zeros) and potentially faulty die(s) too. These determined candidates are then used to flag the potentially bad dies in order. Alternatively, if the sorter logic 152 sorts the counted values based on the number of zeros in ascending order, the top sorting results are the most likely candidates for faulty die(s) with the most/all zero bits, while the bottom sorting results would be the most likely candidates for faulty die(s) with the most/all one bits. Hence, sorter logic 152 may perform various sorting operations, e.g., in ascending/descending order and/or based on the counted number of zeros and/or ones it bits read from a portion of the memory dies.

Moreover, while the top and bottom sorted results/entries are considered as top candidates for faulty die detection in some embodiments (e.g., where the sorting is done per the number of ones and/or the number of zeros read from each die portion), the next entries (following the top and bottom sorted results/entries in sort order) can be used to determine the next likely faulty die(s). The counting may be done for each word line or other portion of the dies (such as banks, etc.) depending on the implementation. Also, the sorted entries/results may be stored in memory (such as any of the memory devices discussed with reference to FIGS. 1-7 herein) for future access.

Accordingly, some embodiments allow for die(s) with the largest error count number to be flagged as the faulty die(s). For example, let us consider that we will count up to 32 bits and make a decision based on the counts for the 10 dies. The good dies will have 50% zeros and ones and the probability of detecting all-zeros or all-ones is $2^{-32}=2.3e-10$. The faulty die which has either word line short circuits or open circuits will have all-zeros or all-ones with probability of 1. This provides a robust technique for detecting faulty dies.

Figure 4:
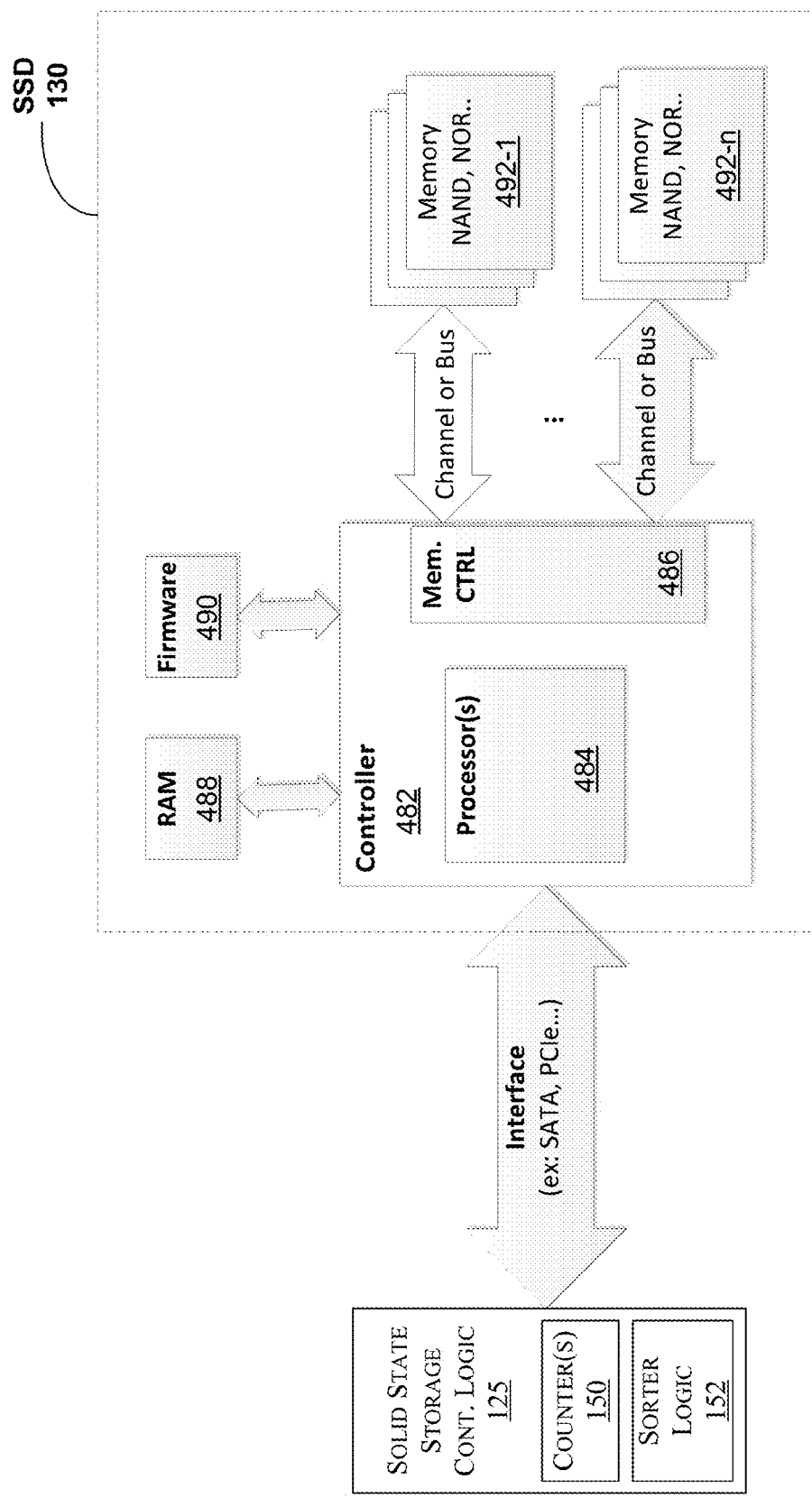
FIG. 4 illustrates a block diagram of various components of an SSD, according to an embodiment.

FIG. 4 illustrates a block diagram of various components of an SSD, according to an embodiment. As shown in FIG. 4, SSD 130 includes a controller logic 482 (which in turn includes one or more processor cores or processors 484 and a memory controller logic 486), Random Access Memory (RAM) 488, firmware storage 490, and one or more memory modules or dies 492-1 to 492-$n$ (which may include 3D Cross Point Memory, NAND, NOR, or other types of non-volatile memory). Memory modules 492-1 to 492-$n$ are coupled to the memory controller logic 486 via one or more memory channels or busses. Also, SSD 130 communicates with logic 125 via an interface (such as a SATA, PCIe (Peripheral Component Interconnect express), etc. interface). One or more of the operations discussed with reference to FIGS. 2-3 may be performed by one or more of the components of FIG. 4 (e.g., processors 484 and/or controller 482 may cause performance of the read operations from memory modules 492-1 to 492-$n$ to cause counting of the number of ones and zeros read). Also, one or more of the operations of FIGS. 2-3 may be programmed into the firmware 490.

Figure 5:
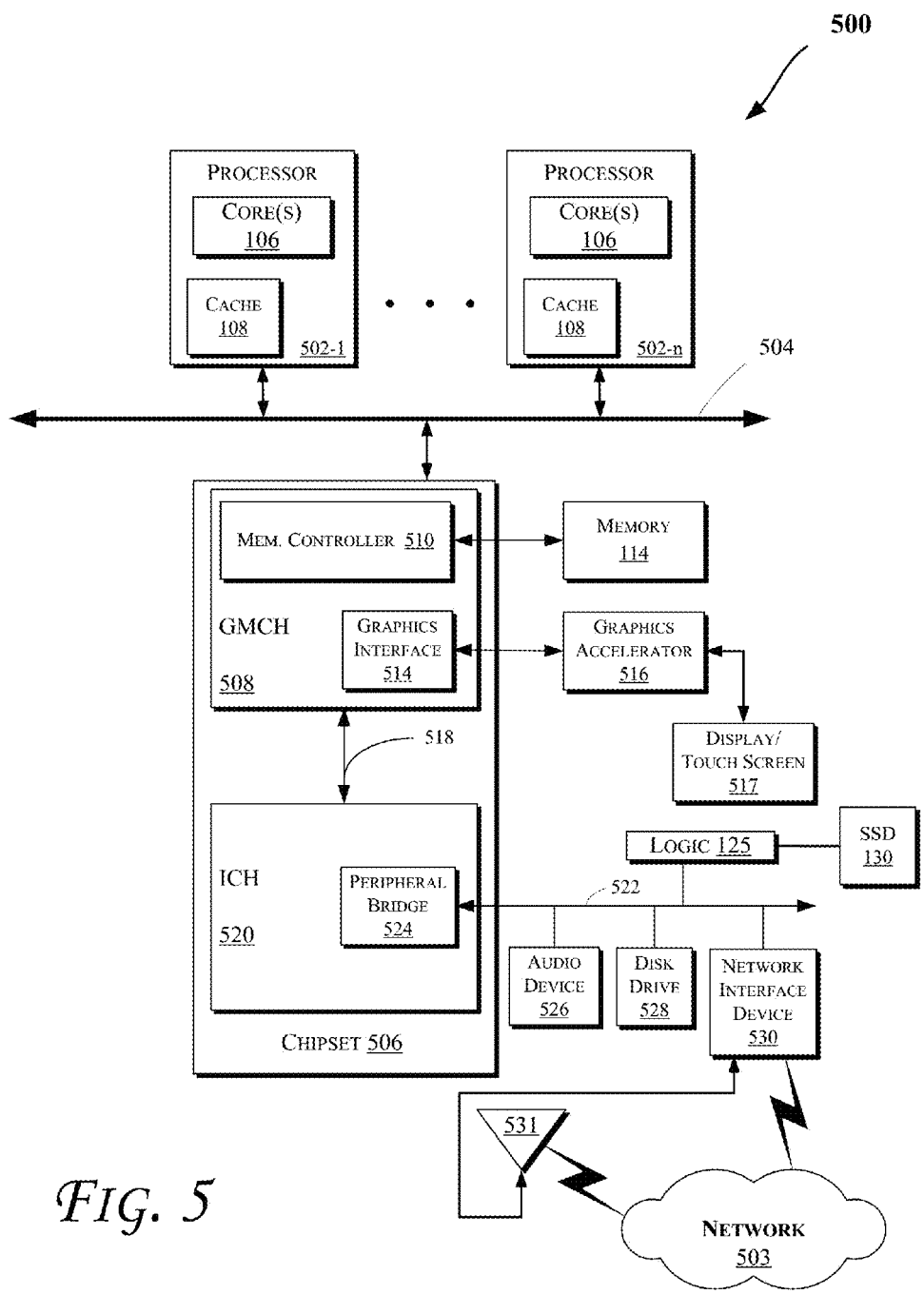

FIG. 5 illustrates a block diagram of a computing system 500 in accordance with an embodiment. The computing system 500 may include one or more central processing unit(s) (CPUs) 502 or processors that communicate via an interconnection network (or bus) 504. The processors 502 may include a general purpose processor, a network processor (that processes data communicated over a computer network 503), an application processor (such as those used in cell phones, smart phones, etc.), or other types of a processor (including a reduced instruction set computer (RISC) processor or a complex instruction set computer (CISC)). Various types of computer networks 503 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 5G, Low Power Embedded (LPE), etc.). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors.

In an embodiment, one or more of the processors 502 may be the same or similar to the processors 102 of FIG. 1. For example, one or more of the processors 502 may include one or more of the cores 106 and/or cache 108. Also, the operations discussed with reference to FIGS. 1-4 may be performed by one or more components of the system 500.

A chipset 506 may also communicate with the interconnection network 504. The chipset 506 may include a graphics and memory control hub (GMCH) 508. The GMCH 508 may include a memory controller 510 (which may be the same or similar to the memory controller 120 of FIG. 1 in an embodiment) that communicates with the memory 114. The memory 114 may store data, including sequences of instructions that are executed by the CPU 502, or any other device included in the computing system 500. Also, system 500 includes logic 125 and SSD 130 (which may be coupled to system 500 via bus 522 such as illustrated, via other interconnects such as 504, where logic 125 is incorporated into chipset 506, etc. in various embodiments). In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk, flash, PCM, 3D Cross Point Memory, Resistive Random Access Memory, memristors, and STTRAM. Additional devices may communicate via the interconnection network 504, such as multiple CPUs and/or multiple system memories.

The GMCH 508 may also include a graphics interface 514 that communicates with a graphics accelerator 516. In one embodiment, the graphics interface 514 may communicate with the graphics accelerator 516 via an accelerated graphics port (AGP) or Peripheral Component Interconnect (PCI) (or PCI express (PCIe) interface). In an embodiment, a display 517 (such as a flat panel display, touch screen, etc.) may communicate with the graphics interface 514 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 517.

A hub interface 518 may allow the GMCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503, e.g., via a wired or wireless interface). As shown, the network interface device 530 may be coupled to an antenna 531 to wirelessly (e.g., via an Institute of Electrical and Electronics Engineers (IEEE) 802.11 interface (including IEEE 802.11a/b/g/n, etc.), cellular interface, 3G, 5G, LPE, etc.) communicate with the network 503. Other devices may communicate via the bus 522. Also, various components (such as the network interface device 530) may communicate with the GMCH 508 in some embodiments. In addition, the processor 502 and the GMCH 508 may be combined to form a single chip. Furthermore, the graphics accelerator 516 may be included within the GMCH 508 in other embodiments.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 6:
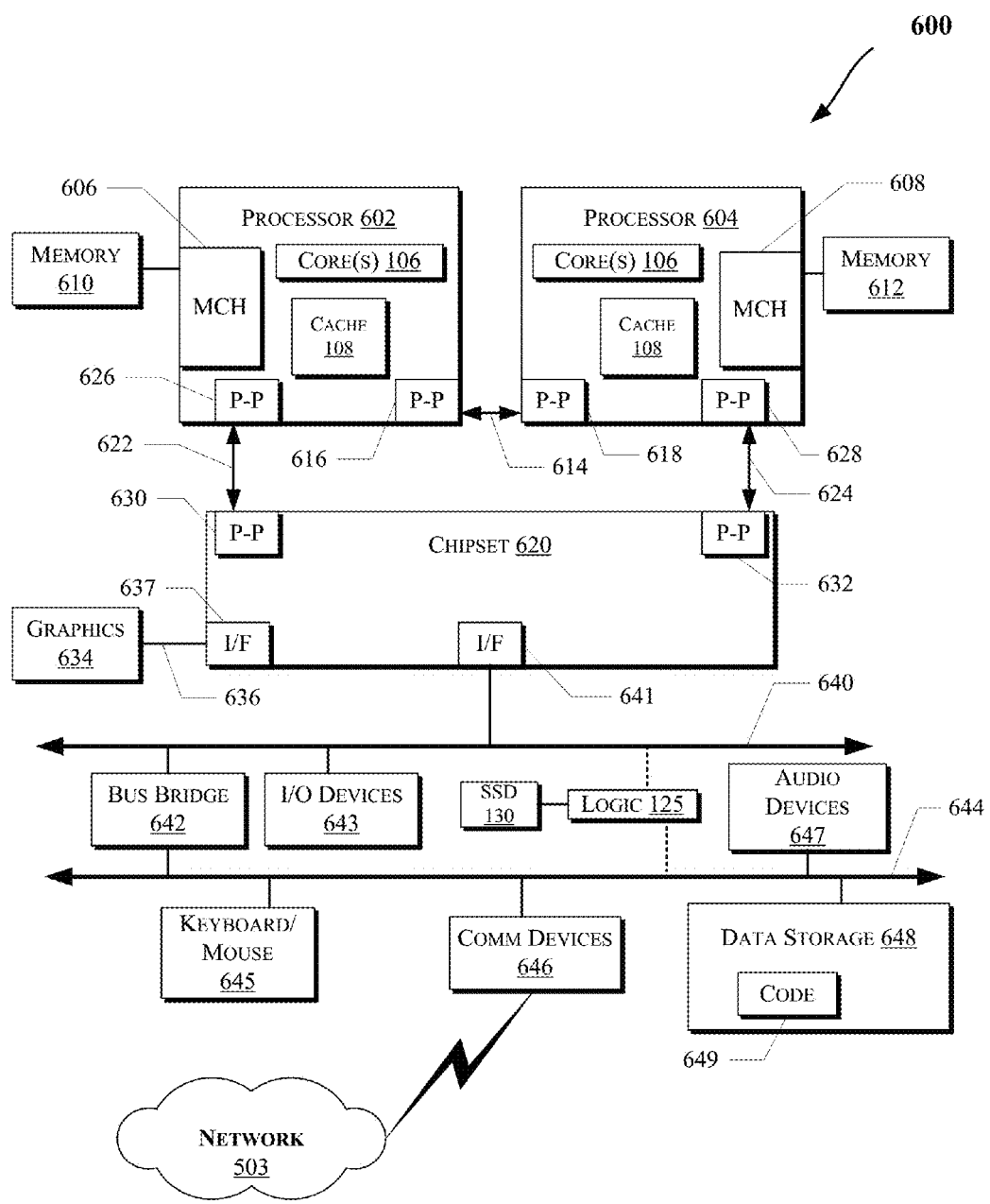

FIG. 6 illustrates a computing system 600 that is arranged in a point-to-point (PtP) configuration, according to an embodiment. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include a local memory controller hub (MCH) 606 and 608 to enable communication with memories 610 and 612. The memories 610 and/or 612 may store various data such as those discussed with reference to the memory 114 of FIGS. 1 and/or 5. Also, MCH 606 and 608 may include the memory controller 120 in some embodiments. Furthermore, system 600 includes logic 125 and SSD 130 (which may be coupled to system 600 via bus 640/644 such as illustrated, via other point-to-point connections to the processor(s) 602/604 or chipset 620, where logic 125 is incorporated into chipset 620, etc. in various embodiments).

In an embodiment, the processors 602 and 604 may be one of the processors 502 discussed with reference to FIG. 5. The processors 602 and 604 may exchange data via a point-to-point (PtP) interface 614 using PtP interface circuits 616 and 618, respectively. Also, the processors 602 and 604 may each exchange data with a chipset 620 via individual PtP interfaces 622 and 624 using point-to-point interface circuits 626, 628, 630, and 632. The chipset 620 may further exchange data with a high-performance graphics circuit 634 via a high-performance graphics interface 636, e.g., using a PtP interface circuit 637. As discussed with reference to FIG. 5, the graphics interface 636 may be coupled to a display device (e.g., display 517) in some embodiments.

As shown in FIG. 6, one or more of the cores 106 and/or cache 108 of FIG. 1 may be located within the processors 602 and 604. Other embodiments, however, may exist in other circuits, logic units, or devices within the system 600 of FIG. 6. Furthermore, other embodiments may be distributed throughout several circuits, logic units, or devices illustrated in FIG. 6.

The chipset 620 may communicate with a bus 640 using a PtP interface circuit 641. The bus 640 may have one or more devices that communicate with it, such as a bus bridge 642 and I/O devices 643. Via a bus 644, the bus bridge 642 may communicate with other devices such as a keyboard/mouse 645, communication devices 646 (such as modems, network interface devices, or other communication devices that may communicate with the computer network 503, as discussed with reference to network interface device 530 for example, including via antenna 531), audio I/O device, and/or a data storage device 648. The data storage device 648 may store code 649 that may be executed by the processors 602 and/or 604.

Figure 7:
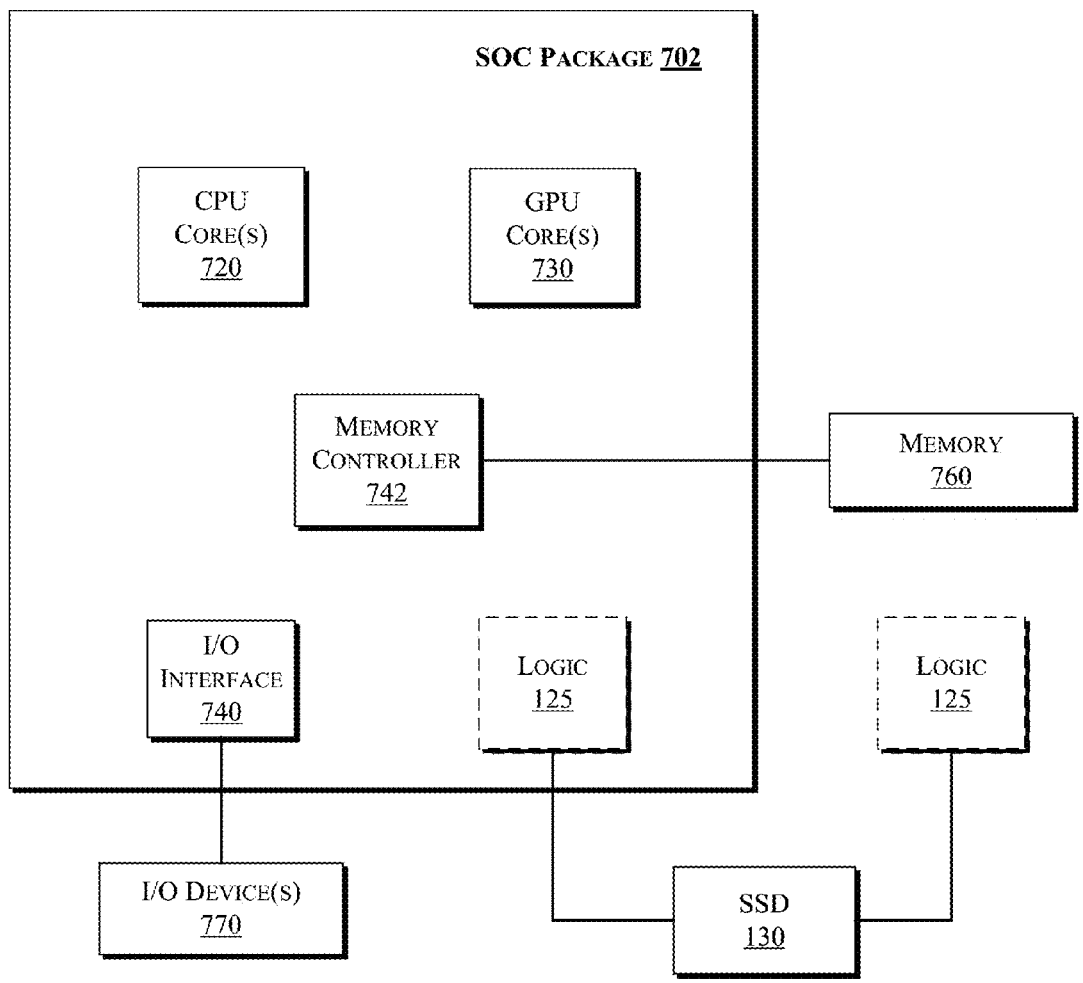

In some embodiments, one or more of the components discussed herein can be embodied as a System On Chip (SOC) device. FIG. 7 illustrates a block diagram of an SOC package in accordance with an embodiment. As illustrated in FIG. 7, SOC 702 includes one or more Central Processing Unit (CPU) cores 720, one or more Graphics Processor Unit (GPU) cores 730, an Input/Output (I/O) interface 740, and a memory controller 742. Various components of the SOC package 702 may be coupled to an interconnect or bus such as discussed herein with reference to the other figures. Also, the SOC package 702 may include more or less components, such as those discussed herein with reference to the other figures. Further, each component of the SOC package 720 may include one or more other components, e.g., as discussed with reference to the other figures herein. In one embodiment, SOC package 702 (and its components) is provided on one or more Integrated Circuit (IC) die, e.g., which are packaged onto a single semiconductor device.

As illustrated in FIG. 7, SOC package 702 is coupled to a memory 760 (which may be similar to or the same as memory discussed herein with reference to the other figures) via the memory controller 742. In an embodiment, the memory 760 (or a portion of it) can be integrated on the SOC package 702.

The I/O interface 740 may be coupled to one or more I/O devices 770, e.g., via an interconnect and/or bus such as discussed herein with reference to other figures. I/O device (s) 770 may include one or more of a keyboard, a mouse, a touchpad, a display, an image/video capture device (such as a camera or camcorder/video recorder), a touch screen, a speaker, or the like. Furthermore, SOC package 702 may include/integrate the logic 125 in an embodiment. Alternatively, the logic 125 may be provided outside of the SOC package 702 (i.e., as a discrete logic).

The following examples pertain to further embodiments. Example 1 includes an apparatus comprising: first logic to determine a plurality of values, wherein each of the plurality of values is to correspond to a number of zeros or a number of ones in bits read from a portion of each of a plurality of memory dies; and second logic to determine one or more candidates as a faulty die amongst the plurality of memory dies based at least in part on a comparison of the plurality of values for the plurality of memory dies. Example 2 includes the apparatus of example 1, wherein the first logic is to comprise at least one counter for each of the plurality of memory dies to count the number of zeros or the number of ones in the bits read from the portion of each of the plurality of memory dies. Example 3 includes the apparatus of example 1, wherein the second logic is to determine the one or more candidates as the faulty die amongst the plurality of memory dies based at least in part on sorting of the plurality of values for the plurality of memory dies. Example 4 includes the apparatus of example 3, wherein the one or more candidates are one or more of top results of the sorting of the plurality of values for the plurality of memory dies. Example 5 includes the apparatus of example 3, wherein the one or more candidates are one or more of bottom results of the sorting of the plurality of values for the plurality of memory dies. Example 6 includes the apparatus of example 1, wherein the portion is to comprise a word line or a memory bank. Example 7 includes the apparatus of example 1, wherein the portion of each of the plurality of memory dies is to store at least part of a codeword. Example 8 includes the apparatus of example 7, wherein the codeword is to comprise a Reed-Solomon (RS) codeword. Example 9 includes the apparatus of example 1, wherein the portion of each of the plurality of memory dies is to store an equal part of a codeword. Example 10 includes the apparatus of example 9, wherein the codeword is to comprise an RS codeword. Example 11 includes the apparatus of example 1, wherein a non-volatile memory device is to comprise the plurality of the memory dies. Example 12 includes the apparatus of example 11, wherein the non-volatile memory device is to comprise one or more of: a solid state device, a phase change memory, a 3D (3-Dimensional) cross point memory, a resistive random access memory, a memristor memory, and a spin torque transfer random access memory. Example 13 includes the apparatus of example 1, wherein one or more of the first logic, the second logic, the plurality of memory dies, and a processor core are on a same integrated circuit die.

Example 14 includes a method comprising: determining a plurality of values, wherein each of the plurality of values corresponds to a number of zeros or a number of ones in bits read from a portion of each of a plurality of memory dies; and determining one or more candidates as a faulty die amongst the plurality of memory dies based at least in part on a comparison of the plurality of values for the plurality of memory dies. Example 15 includes the method of example 14, wherein determining the plurality of values comprises counting the number of zeros or the number of ones in the bits read from the portion of each of the plurality of memory dies. Example 16 includes the method of example 14, wherein determining the one or more candidates as the faulty die amongst the plurality of memory dies is performed based at least in part on sorting of the plurality of values for the plurality of memory dies. Example 17 includes the method of example 16, wherein the one or more candidates are one or more of top results of the sorting of the plurality of values for the plurality of memory dies. Example 18 includes the method of example 16, wherein the one or more candidates are one or more of bottom results of the sorting of the plurality of values for the plurality of memory dies. Example 19 includes the method of example 14, wherein the portion comprises a word line or a memory bank. Example 20 includes the method of example 14, wherein the portion of each of the plurality of memory dies stores at least part of a codeword. Example 21 includes the method of example 14, wherein the portion of each of the plurality of memory dies stores an equal part of a codeword. Example 22 includes the method of example 14, wherein the plurality of the memory dies are included in one or more of: a solid state device, a phase change memory, a 3D (3-Dimensional) cross point memory, a resistive random access memory, a memristor memory, and a spin torque transfer random access memory.

Example 23 includes a computer-readable medium comprising one or more instructions that when executed on a processor configure the processor to perform one or more operations to: determine a plurality of values, wherein each of the plurality of values corresponds to a number of zeros or a number of ones in bits read from a portion of each of a plurality of memory dies; and determine one or more candidates as a faulty die amongst the plurality of memory dies based at least in part on a comparison of the plurality of values for the plurality of memory dies. Example 24 includes the computer-readable medium of example 23, further comprising one or more instructions that when executed on the processor configure the processor to perform one or more operations to cause a determination of the plurality of values by counting the number of zeros or the number of ones in the bits read from the portion of each of the plurality of memory dies. Example 25 includes the computer-readable medium of example 23, further comprising one or more instructions that when executed on the processor configure the processor to perform one or more operations to cause a determination of the one or more candidates as the faulty die amongst the plurality of memory dies based at least in part on sorting of the plurality of values for the plurality of memory dies.

Example 26 includes a computer-readable medium comprising one or more instructions that when executed on a processor configure the processor to perform one or more operations of any of examples 14 to 22. Example 27 includes an apparatus comprising means to perform a method as set forth in any of examples 14 to 22. Example 28 includes an apparatus comprising means to perform a method as set forth in any preceding example. Example 29 includes a machine-readable storage including machine-readable instructions, when executed, to implement a method or realize an apparatus as set forth in any preceding example.

Example 30 includes a system comprising: a plurality of memory dies; and at least one processor core to access the plurality of memory dies; first logic to determine a plurality of values, wherein each of the plurality of values is to correspond to a number of zeros or a number of ones in bits read from a portion of each of the plurality of memory dies; and second logic to determine one or more candidates as a faulty die amongst the plurality of memory dies based at least in part on a comparison of the plurality of values for the plurality of memory dies. Example 31 includes the system of example 30, wherein the first logic is to comprise at least one counter for each of the plurality of memory dies to count the number of zeros or the number of ones in the bits read from the portion of each of the plurality of memory dies. Example 32 includes the system of example 30, wherein the second logic is to determine the one or more candidates as the faulty die amongst the plurality of memory dies based at least in part on sorting of the plurality of values for the plurality of memory dies. Example 33 includes the system of example 32, wherein the one or more candidates are one or more of top results of the sorting of the plurality of values for the plurality of memory dies. Example 34 includes the system of example 32, wherein the one or more candidates are one or more of bottom results of the sorting of the plurality of values for the plurality of memory dies. Example 35 includes the system of example 30, wherein the portion is to comprise a word line or a memory bank. Example 36 includes the system of example 30, wherein the portion of each of the plurality of memory dies is to store at least part of a codeword. Example 37 includes the system of example 36, wherein the codeword is to comprise a Reed-Solomon (RS) codeword. Example 38 includes the system of example 30, wherein the portion of each of the plurality of memory dies is to store an equal part of a codeword. Example 39 includes the system of example 38, wherein the codeword is to comprise an RS codeword. Example 40 includes the system of example 30, wherein a non-volatile memory device is to comprise the plurality of the memory dies. Example 41 includes the system of example 40, wherein the non-volatile memory device is to comprise one or more of: a solid state device, a phase change memory, a 3D (3-Dimensional) cross point memory, a resistive random access memory, a memristor memory, and a spin torque transfer random access memory. Example 42 includes the system of example 30, wherein one or more of the first logic, the second logic, the plurality of memory dies, and the at least one processor core are on a same integrated circuit die.

In various embodiments, the operations discussed herein, e.g., with reference to FIGS. 1-7, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-7.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   first logic to determine a plurality of values, wherein each of the plurality of values is to correspond to one of: a number count of zeros in bits read from a portion of each of a plurality of memory dies or a number count of ones in bits read from the portion of each of the plurality of memory dies; and
   second logic to determine one or more candidates as a faulty die amongst the plurality of memory dies based at least in part on a comparison of the plurality of values for the plurality of memory dies, wherein the second logic is to detect the faulty die based at least in part on encoded user data distributed over the plurality of memory dies, wherein the portion of each of the plurality of memory dies is to store an equal portion of a single codeword, wherein, in case of an error that impedes forward progress, one or more bits of the codeword are to be reconstructed based on an operation to be localized for a first die of the plurality of memory dies with a higher Raw Bit Error Rate (RBER) than other dies from the plurality of memory dies.

2. The apparatus of claim 1, wherein the first logic is to comprise at least one counter for each of the plurality of memory dies to count the number of zeros or the number of ones in the bits read from the portion of each of the plurality of memory dies.

3. The apparatus of claim 1, wherein the second logic is to determine the one or more candidates as the faulty die amongst the plurality of memory dies based at least in part on sorting of the plurality of values for the plurality of memory dies.

4. The apparatus of claim 3, wherein the one or more candidates are one or more of top results of the sorting of the plurality of values for the plurality of memory dies.

5. The apparatus of claim 3, wherein the one or more candidates are one or more of bottom results of the sorting of the plurality of values for the plurality of memory dies.

6. The apparatus of claim 1, wherein the portion is to comprise a word line or a memory bank.

7. The apparatus of claim 1, wherein the codeword is to comprise a Reed-Solomon (RS) codeword.

8. The apparatus of claim 1, wherein a non-volatile memory device is to comprise the plurality of the memory dies.

9. The apparatus of claim 8, wherein the non-volatile memory device is to comprise one or more of: a solid state device, a phase change memory, a 3D (3-Dimensional) cross point memory, a resistive random access memory, a memristor memory, and a spin torque transfer random access memory.

10. The apparatus of claim 1, wherein one or more of the first logic, the second logic, the plurality of memory dies, and a processor core are on a same integrated circuit die.

11. The apparatus of claim 1, wherein the operation is an XOR operation to be performed by an XOR die.

12. The apparatus of claim 1, wherein the operation is to be performed based on a decode to be done after flagging the one or more bits as erasures.

13. The apparatus of claim 1, wherein each of the plurality of memory dies are to store the portion of the single codeword, error detection code, and meta data.

14. A method comprising:
   determining a plurality of values, wherein each of the plurality of values corresponds to one of: a number count of zeros in bits read from a portion of each of a plurality of memory dies or a number count of ones in bits read from the portion of each of the plurality of memory dies; and
   determining one or more candidates as a faulty die amongst the plurality of memory dies based at least in part on a comparison of the plurality of values for the plurality of memory dies, wherein determining the one or more candidates is to comprise encoding of user data and distributing a codeword over the plurality of memory dies, wherein the portion of each of the plurality of memory dies stores an equal portion of a single codeword, wherein, in case of an error that impedes forward progress, one or more bits of the codeword are reconstructed based on an operation to be localized for a first die of the plurality of memory dies with a higher Raw Bit Error Rate (RBER) than other dies from the plurality of memory dies.

15. The method of claim 14, wherein determining the plurality of values comprises counting the number of zeros or the number of ones in the bits read from the portion of each of the plurality of memory dies.

16. The method of claim 14, wherein determining the one or more candidates as the faulty die amongst the plurality of memory dies is performed based at least in part on sorting of the plurality of values for the plurality of memory dies.

17. The method of claim 16, wherein the one or more candidates are one or more of top results of the sorting of the plurality of values for the plurality of memory dies.

18. The method of claim 16, wherein the one or more candidates are one or more of bottom results of the sorting of the plurality of values for the plurality of memory dies.

19. The method of claim 14, wherein the portion comprises a word line or a memory bank.

20. The method of claim 14, wherein the plurality of the memory dies are included in one or more of: a solid state device, a phase change memory, a 3D (3-Dimensional) cross point memory, a resistive random access memory, a memristor memory, and a spin torque transfer random access memory.

21. A system comprising:
   a plurality of memory dies; and
   at least one processor core to access the plurality of memory dies;
   first logic to determine a plurality of values, wherein each of the plurality of values is to correspond to one of: a number count of zeros in bits read from a portion of each of a plurality of memory dies or a number count of ones in bits read from the portion of each of the plurality of memory dies; and
   second logic to determine one or more candidates as a faulty die amongst the plurality of memory dies based at least in part on a comparison of the plurality of values for the plurality of memory dies, wherein the second logic is to detect the faulty die based at least in part on encoded user data distributed over the plurality of memory dies, wherein the portion of each of the plurality of memory dies is to store an equal portion of a single codeword, wherein, in case of an error that impedes forward progress, one or more bits of the codeword are to be reconstructed based on an operation to be localized for a first die of the plurality of memory dies with a higher Raw Bit Error Rate (RBER) than other dies from the plurality of memory dies.

22. The system of claim 21, wherein the first logic is to comprise at least one counter for each of the plurality of memory dies to count the number of zeros or the number of ones in the bits read from the portion of each of the plurality of memory dies.

23. The system of claim 21, wherein the second logic is to determine the one or more candidates as the faulty die amongst the plurality of memory dies based at least in part on sorting of the plurality of values for the plurality of memory dies.

* * * * *